(12) United States Patent
Chen et al.

(10) Patent No.: US 7,855,886 B1
(45) Date of Patent: Dec. 21, 2010

(54) ELECTRONIC DEVICE AND HEAT DISSIPATION APPARATUS THEREOF

(75) Inventors: Xiao-Zhu Chen, Shenzhen (CN); Zhen-Xing Ye, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/560,446

(22) Filed: Sep. 16, 2009

(51) Int. Cl.
*H05K 7/20* (2006.01)

(52) U.S. Cl. .................. 361/695; 361/679.48; 361/694; 454/184

(58) Field of Classification Search ........................ None
See application file for complete search history.

(56) References Cited

U.S. PATENT DOCUMENTS

| | | | | |
|---|---|---|---|---|
| 5,562,410 A | * | 10/1996 | Sachs et al. ............... | 415/213.1 |
| 6,552,898 B1 | * | 4/2003 | Noble ...................... | 361/679.5 |
| 7,042,722 B2 | * | 5/2006 | Suzuki et al. ............... | 361/695 |
| 7,515,413 B1 | * | 4/2009 | Curtis ......................... | 361/695 |
| 7,580,260 B2 | * | 8/2009 | Figuerado .................... | 361/695 |
| 7,715,193 B1 | * | 5/2010 | Ye et al. ..................... | 361/695 |
| 7,748,229 B2 | * | 7/2010 | Gwin et al. ................. | 62/259.2 |
| 7,817,416 B2 | * | 10/2010 | Chen ..................... | 361/679.48 |
| 2006/0023422 A1 | * | 2/2006 | Shum et al. .................. | 361/695 |
| 2008/0124234 A1 | * | 5/2008 | Echazarreta ........... | 417/423.14 |
| 2009/0201642 A1 | * | 8/2009 | Diaz .......................... | 361/695 |
| 2010/0033929 A1 | * | 2/2010 | Chen .......................... | 361/695 |

\* cited by examiner

*Primary Examiner*—Boris L Chervinsky
(74) *Attorney, Agent, or Firm*—Zhigang Ma

(57) ABSTRACT

An electronic device can conveniently change and assemble a heat dissipation apparatus which is received in the electronic device and dissipates heat for the electronic device. The electronic device with a fan heat dissipation apparatus can be replaced by a blower heat dissipation apparatus, without changing a chassis of the electronic device.

11 Claims, 12 Drawing Sheets

ELECTRONIC DEVICE AND HEAT DISSIPATION APPARATUS THEREOF

BACKGROUND

1. Technical Field

The present disclosure relates to electronic devices, and particularly to an electronic device for conveniently changing and assembling a heat dissipation apparatus.

2. Description of Related Art

Heat dissipation apparatuses using fans or blowers mounted to electronic devices are generally designed to have different structures. However, if an electronic device with a fan heat dissipation apparatus is replaced by a blower heat dissipation apparatus, a chassis of the electronic device may also need to be changed, thereby bringing inevitably cost increase.

DETAILED DESCRIPTION

Figure 1:
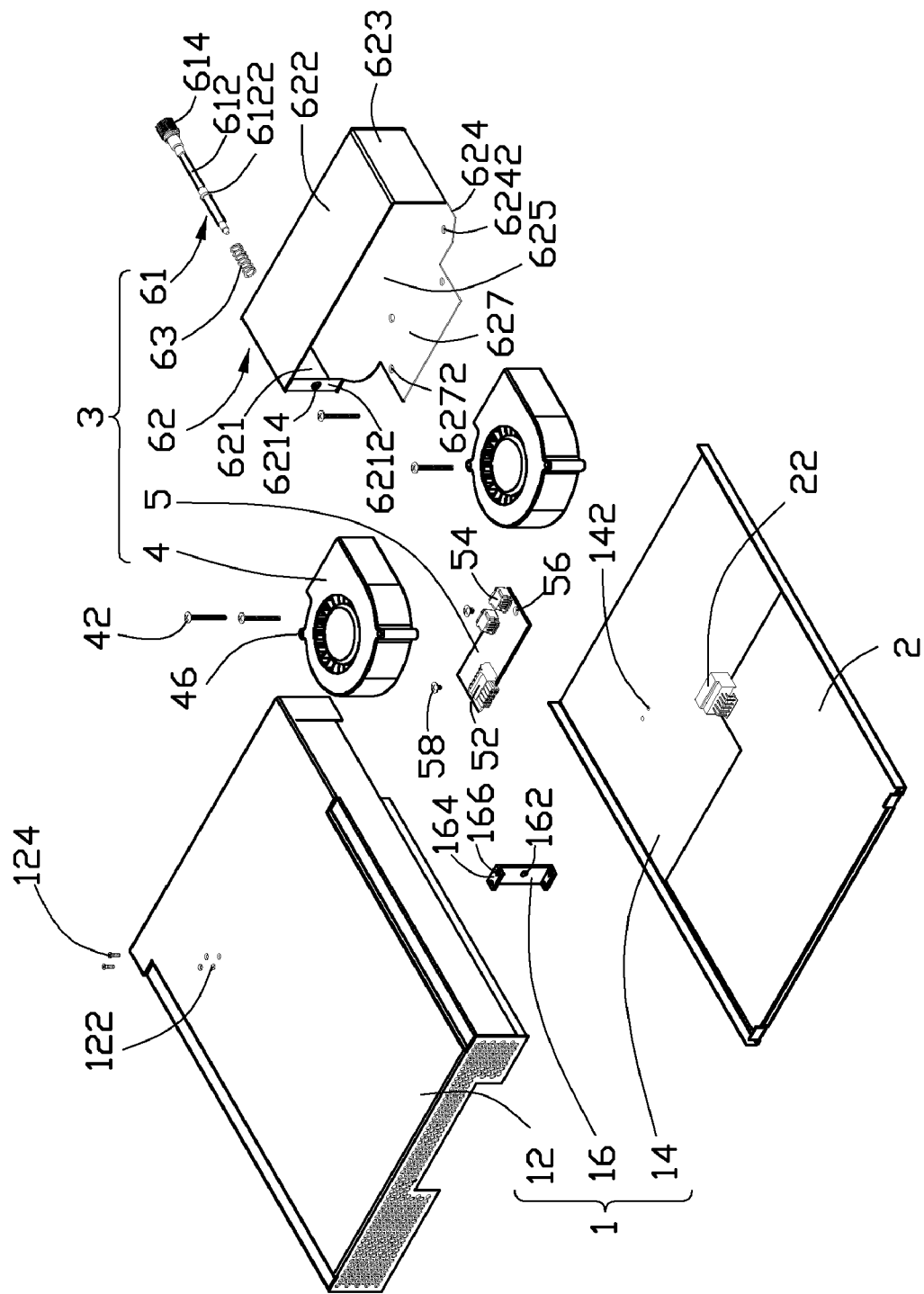
FIG. 1 is an exploded, isometric view of a first exemplary embodiment of an electronic device.
Figure 2:
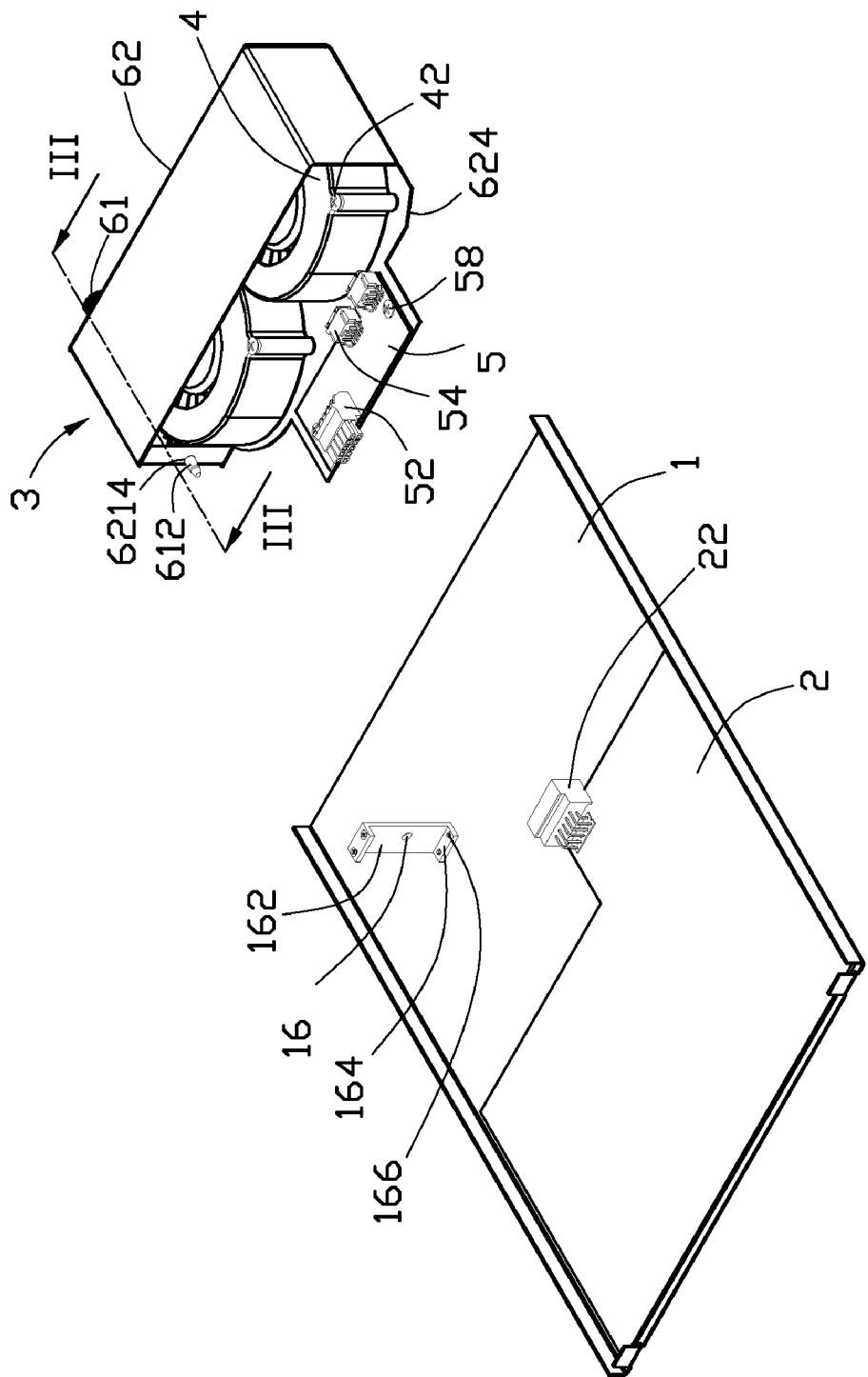
FIG. 2 is a partially assembled, isometric view of the electronic device of FIG. 1.
Figure 3:
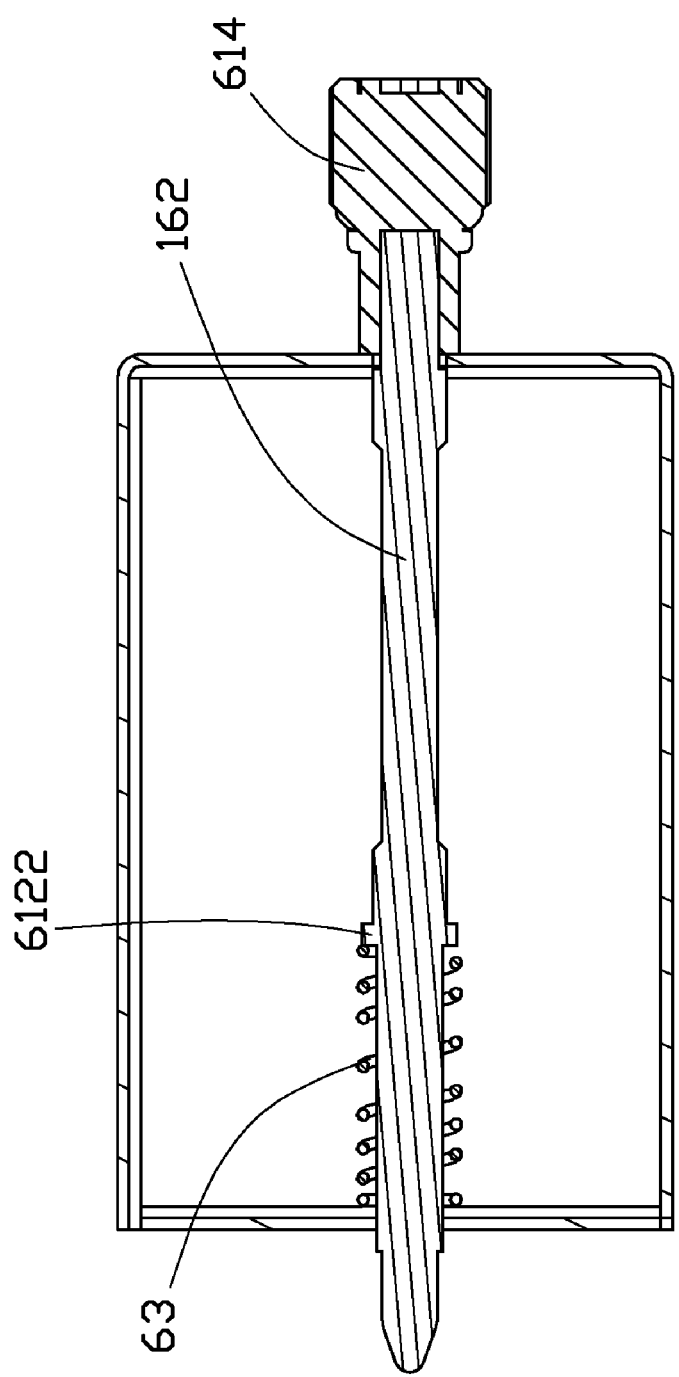
FIG. 3 is a cross-sectional view of FIG. 2, taken along the line III-III.
Figure 4:
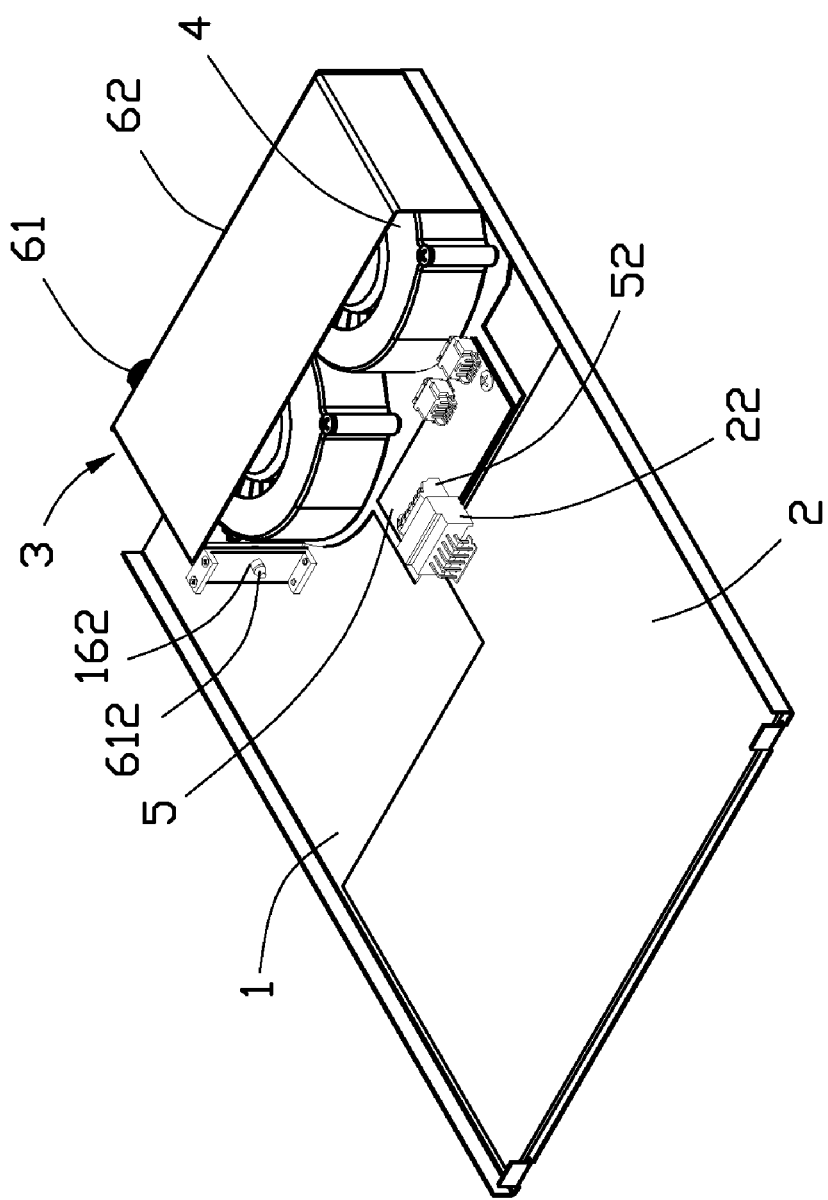
FIG. 4 is an assembled, isometric view of FIG. 2.

Referring to FIGS. 1 to 7, a first exemplary embodiment of an electronic device includes a chassis 1, a motherboard 2 received in the chassis 1, and a heat dissipation apparatus 3 mounted to the motherboard 2. In one embodiment, the electronic device may be a storage bridge bay (SBB) power supply system.

The chassis 1 includes a cover 12, a base 14, and a fixing member 16. A mounting hole 162 is defined in a center of the fixing member 16. Two tabs 164 extend in the same direction from opposite ends of the fixing member 16. Each tab 164 defines two fixing holes 166. Two through holes 122 are defined in the cover 12, and two through holes 142 are defined in the base 14 corresponding to the fixing holes 166.

The motherboard 2 is mounted to the base 14 of the chassis 1 via screws (not shown). The motherboard 2 includes a first connector 22 and other components, such as a central processing unit (CPU), south and/or north bridge chips.

The heat dissipation apparatus 3 includes a plurality of heat dissipation components, such as two blowers 4, a control board 5, a receiving member 62 for receiving the blowers 4 and the control board 5, a connection member 61, and an elastic member, such as a helical spring 63. Each blower 4 vertically defines two through holes 46 in opposite sidewalls of the blower 4.

The control board 5 includes a second connector 52 and two third connectors 54. The control board 5 defines two through holes 56 in opposite ends of the control board 5. The second connector 52 can be engaged with the first connector 22 of the motherboard 2, and the two third connectors 54 are connected to the second connector 52. The first connector 22 and the second connector 52 each include five pins 1-5 arranged at a top row and five pins 6-10 arranged at a bottom row respectively. Names of the pins 1-5 of the top row and the pins 10-6 of the bottom row from left to right of each of the first connector 22 and the second connector 52 are shown in table 1.

TABLE 1

| pins of the first connector and the second connector | | | | | |
|---|---|---|---|---|---|
| First connector | | | | | |
| Top row | 1 | 2 | 3 | 4 | 5 |
| Name | rotary speed | rotary speed | rotary speed | rotary speed | power supply |
| Bottom row | 10 | 9 | 8 | 7 | 6 |
| Name | speed regulation | speed regulation | speed regulation | speed regulation | ground |
| Second connector | | | | | |
| Top row | 1 | 2 | 3 | 4 | 5 |
| Name | power supply | rotary speed | rotary speed | — | — |
| Bottom row | 10 | 9 | 8 | 7 | 6 |
| Name | ground | speed regulation | speed regulation | — | — |

Each column of two pins in table 1 as a group, such as the "rotary speed" pin 2 and the "speed regulation" pin 9, control a blower 4. When the second connector 52 is inserted into the first connector 22, the power supply pin 1, the rotary speed pins 2 and 3, and the speed regulation pins 8 and 9 of the second connector 52 are correspondingly connected to the power supply pin 5, the rotary speed pins 4 and 3, and the speed regulation pins 7 and 8 of the first connector 22.

Each third connector 54 includes a row of four pins 1-4, and names of the pins 1-4 from left to right are shown in table 2.

TABLE 2

| pins of the third connector | | | | |
|---|---|---|---|---|
| Pin | 1 | 2 | 3 | 4 |
| Name | ground | rotary speed | speed regulation | power supply |

The first connector 22 outputs a power signal and a plurality of control signals from the motherboard 2, and receives a plurality of state signals from the blowers 4. The control signals are speed regulation signals, to control rotary speeds of the blowers 4, and the state signals are rotary speed signals of the blowers 4. After the second connector 52 is inserted into the first connector 22, the two third connectors 54 receive the power signal and the speed regulation signals output from the second connector 52, and output the rotary speed signals to the motherboard 2 via the first connector 22 and the second connector 52. Each power supply pin 4 of the third connectors 54 is connected to the power supply pin 1 of the second connector 52. Each ground pin 1 of the third connectors 54 is connected to the ground pin 10 of the second connector 52. The rotary speed pin 2 and the speed regulation pin 3 of one third connector 54 are connected to the rotary speed pin 2 and the speed regulation pin 9 of the second connector 52 respectively. The rotary speed pin 2 and the speed regulation pin 3 of the other third connector 54 are connected to the rotary speed pin 3 and the speed regulation pin 8 of the second connector 52 respectively.

The connection member 61 includes a column-shaped main body 612 and a head 614 connected to a first end of the main body 612. A diameter of the head 614 is greater than a diameter of the main body 612. A ring-shaped protrusion 6122 protrudes from a circumference of the main body 612.

Figure 5:
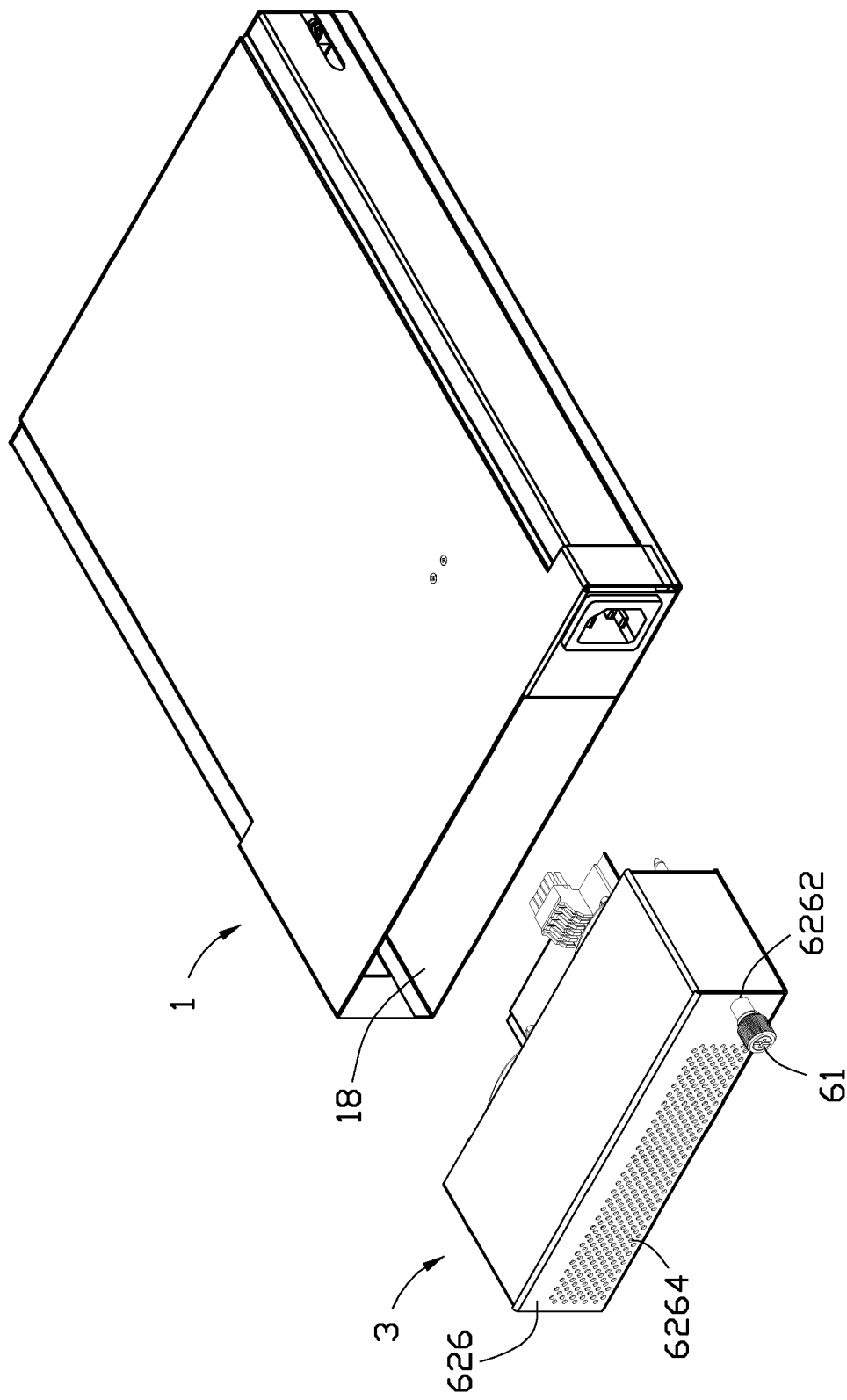
FIG. 5 is a partially assembled, isometric view of the electronic device of FIG. 1, but viewed from another aspect.
Figure 6:
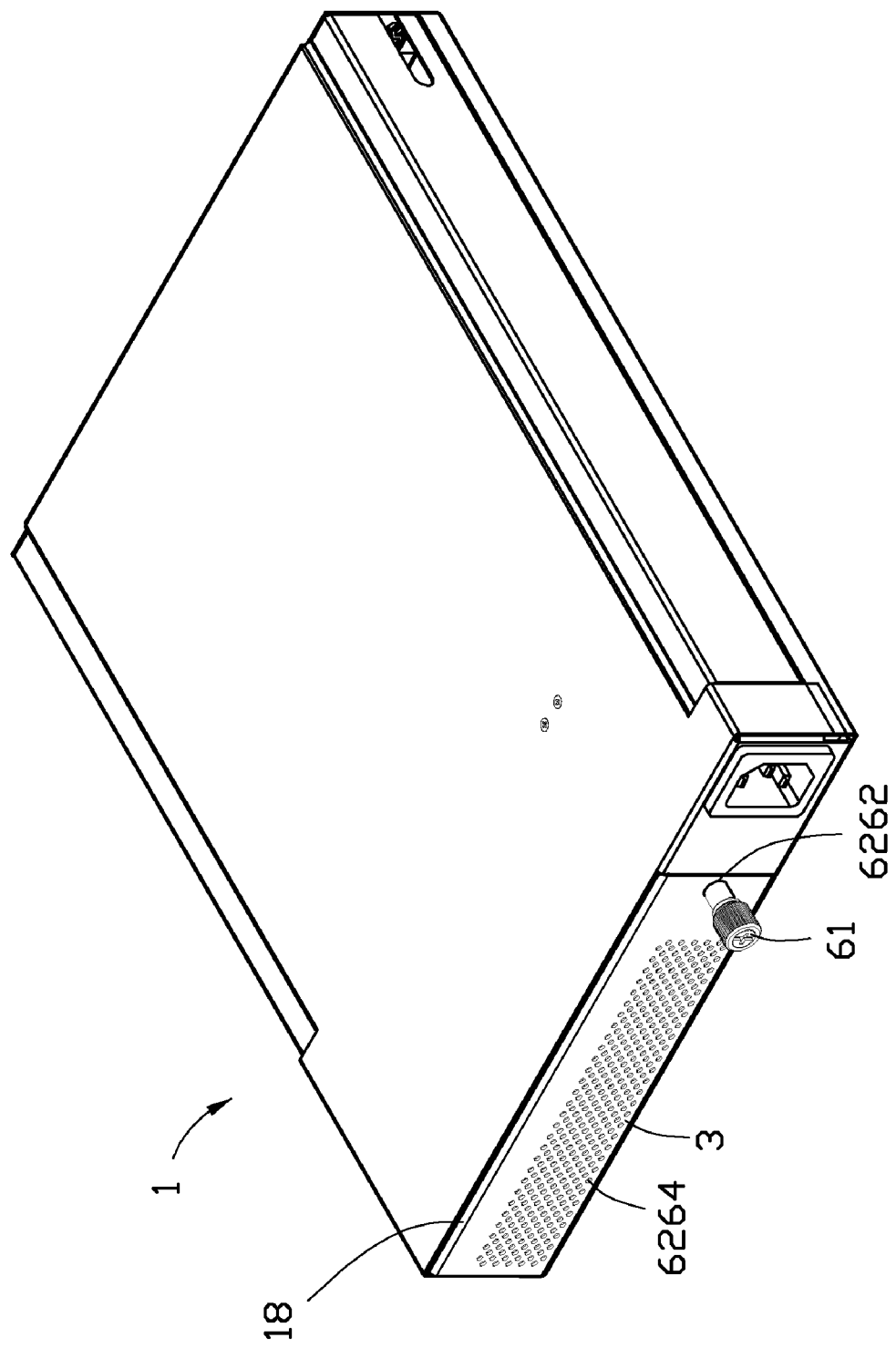
FIG. 6 is an assembled, isometric view of FIG. 5.
Figure 7:
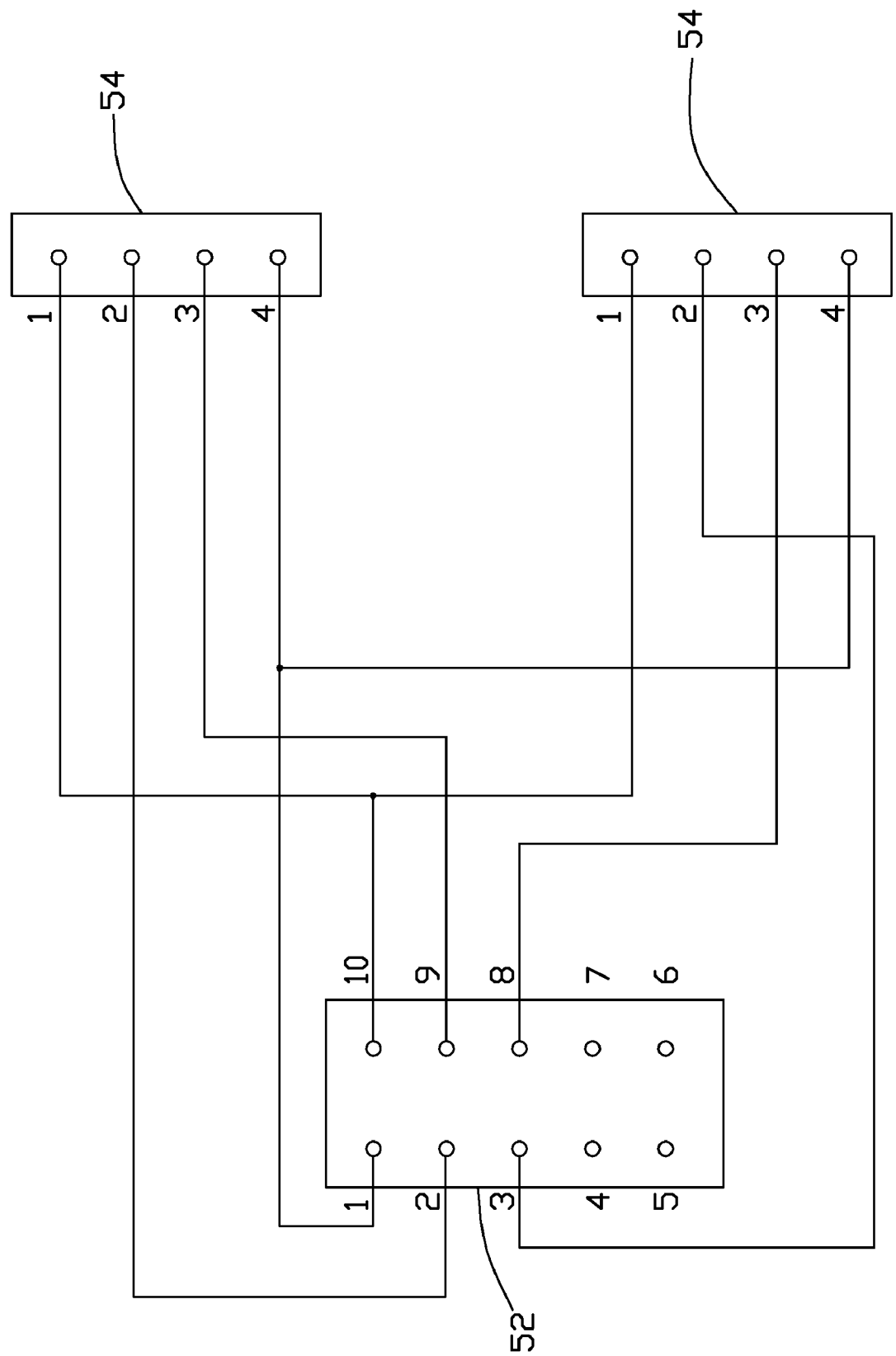
FIG. 7 is a circuit diagram showing a second connector connected to a third connector of a control board of FIG. 1.
Figure 8:
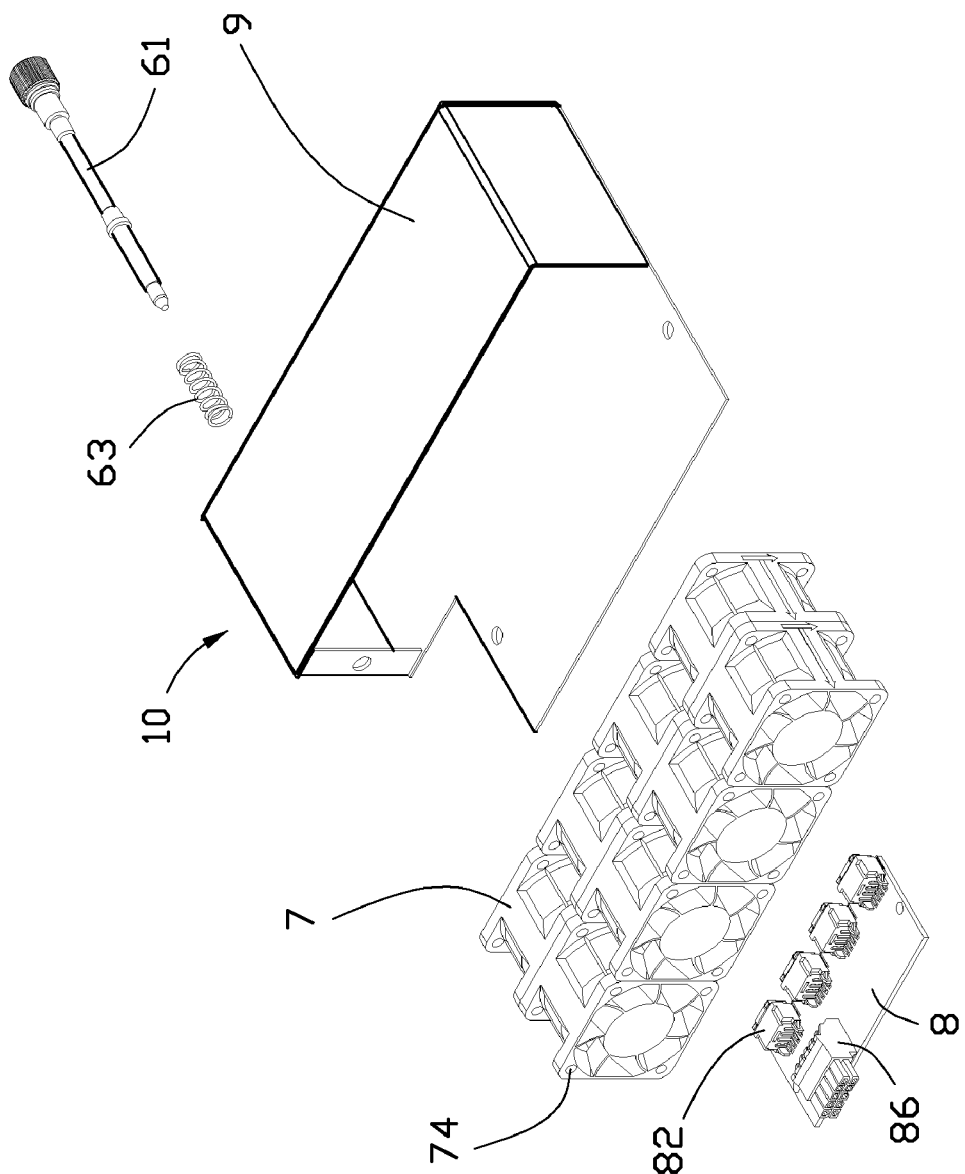
FIG. 8 is an exploded, isometric view of a second exemplary embodiment of a heat dissipation apparatus of an electronic device.
Figure 9:
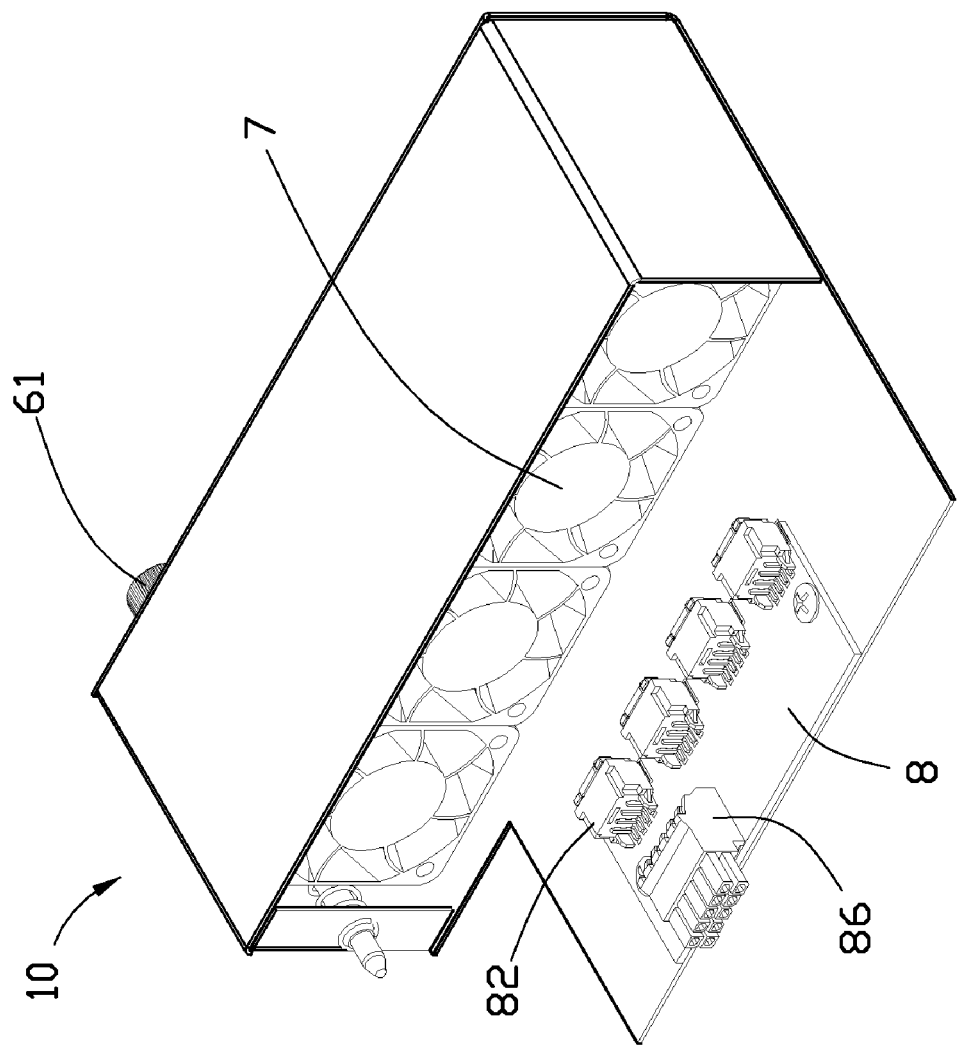
FIG. 9 is an assembled, isometric view of FIG. 8.
Figure 10:
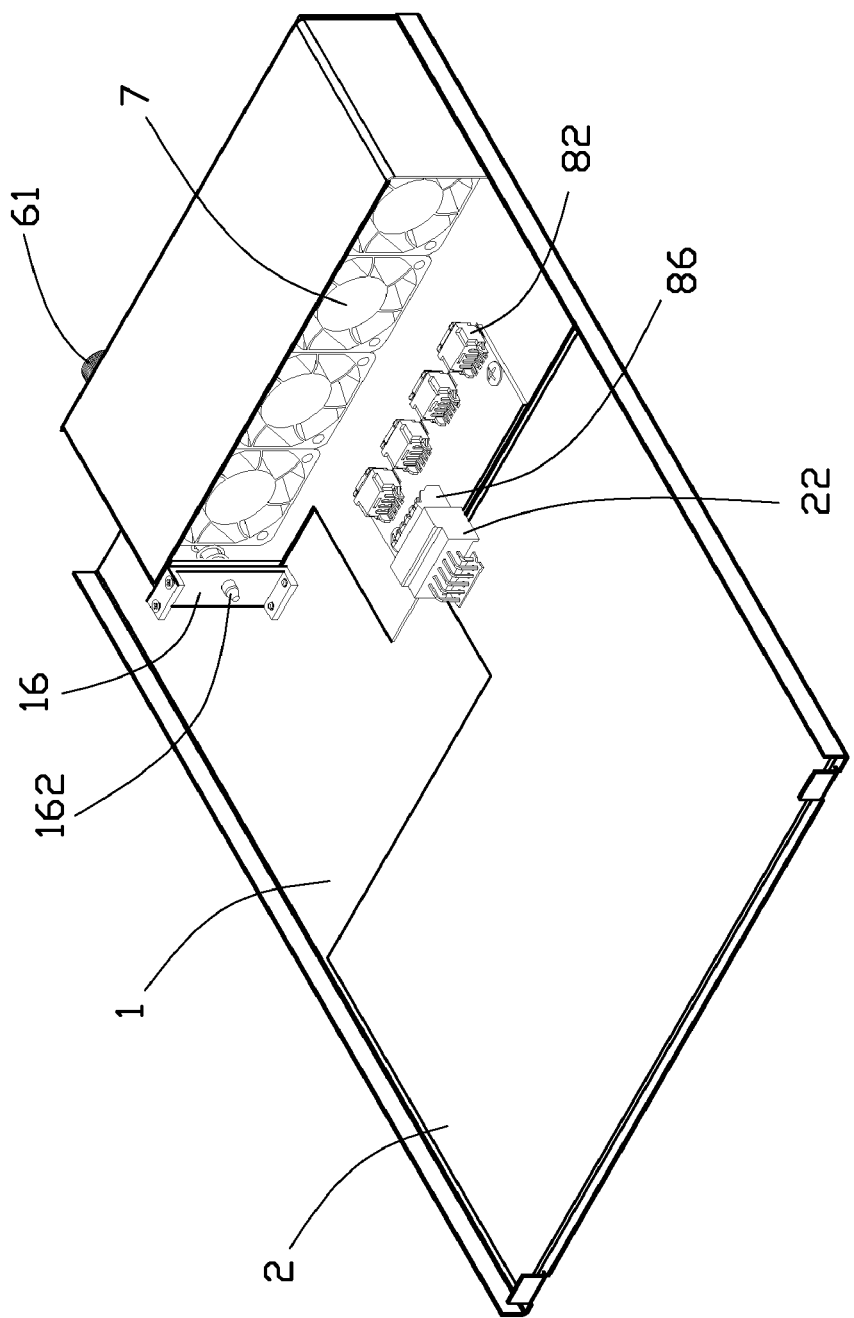
FIG. 10 is an assembled, isometric view of the heat dissipation apparatus and a motherboard of the electronic device of FIG. 8.
Figure 11:
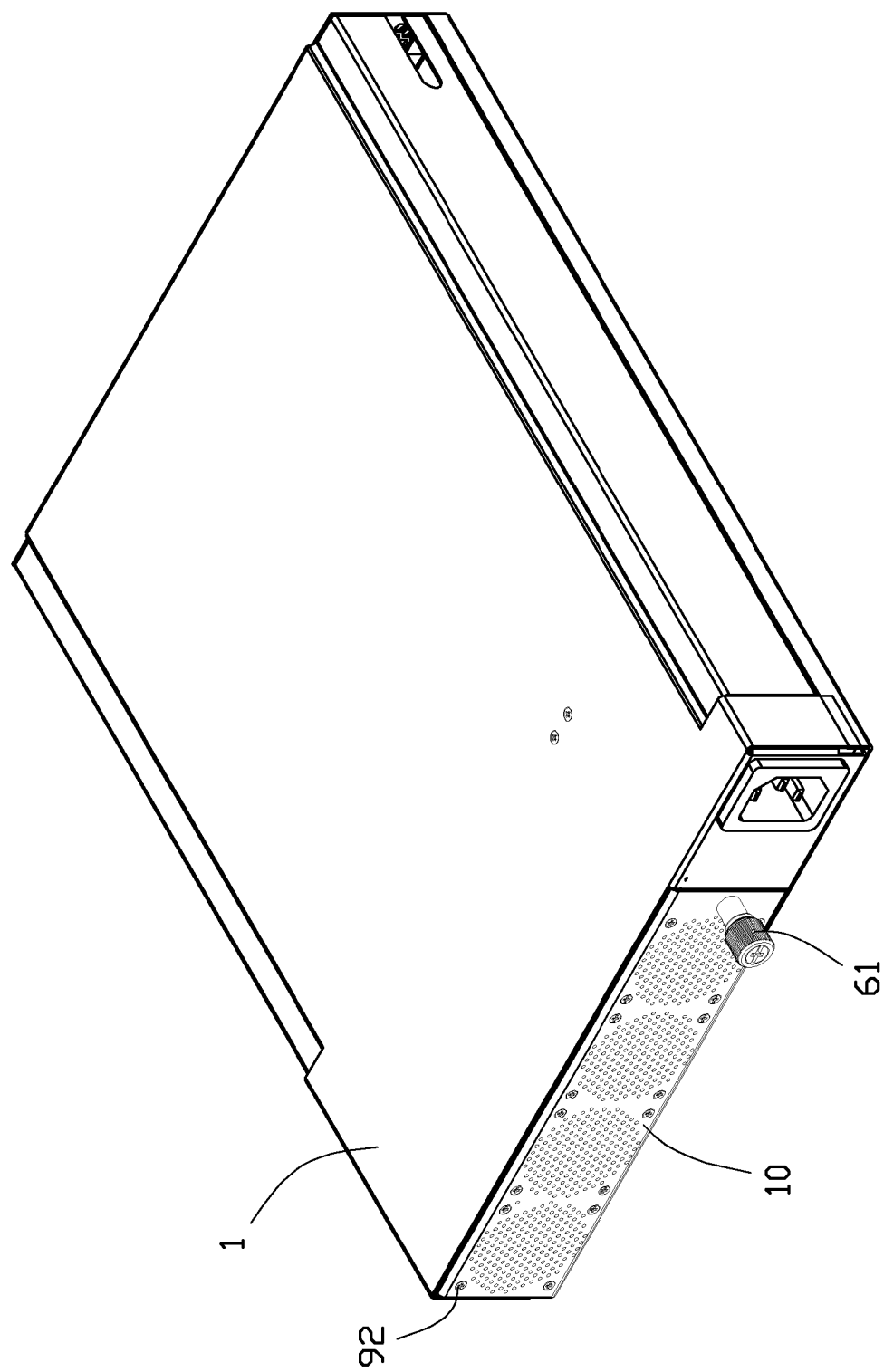
FIG. 11 is an exploded, isometric view of the electronic device of the second exemplary embodiment.
Figure 12:
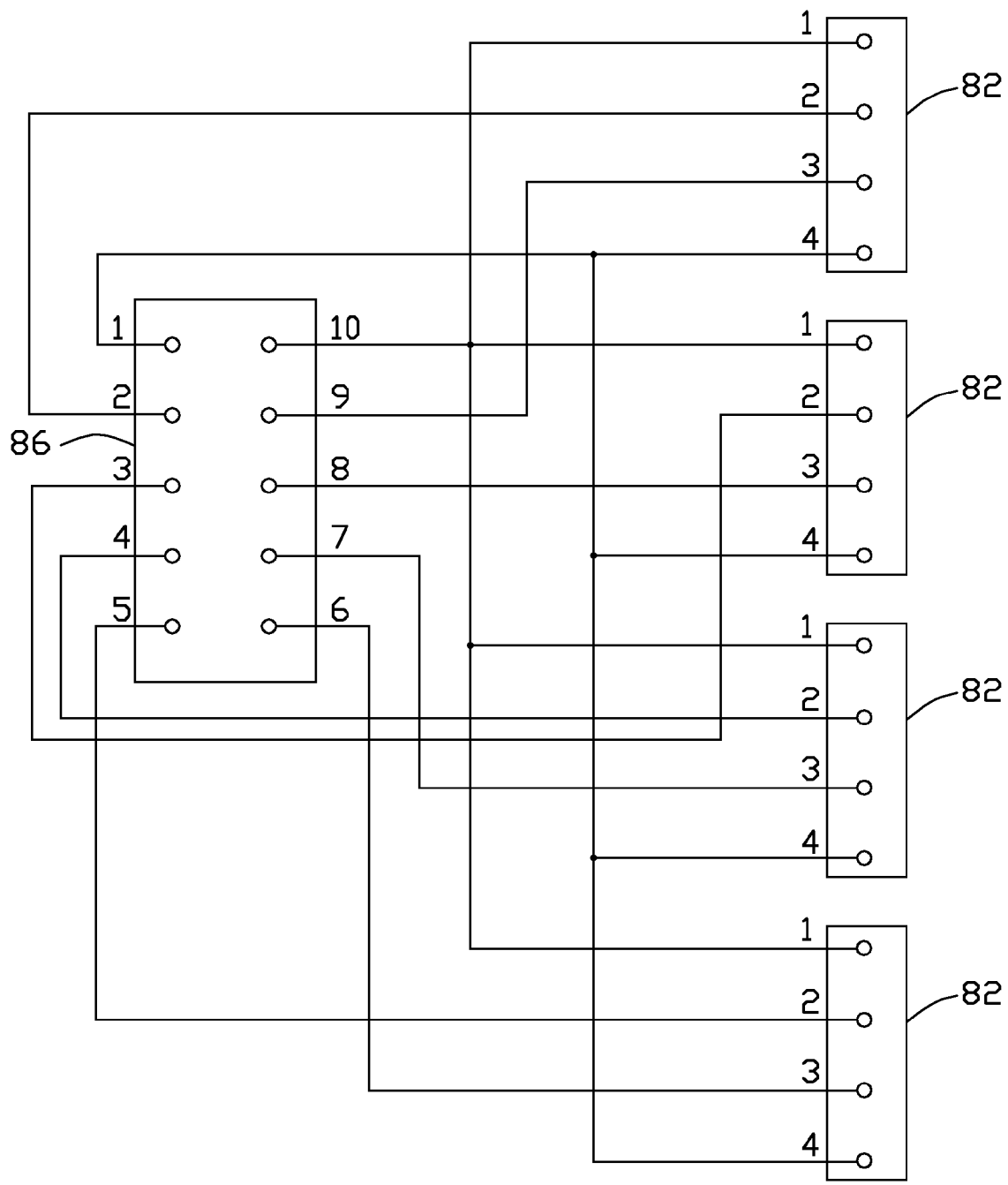
FIG. 12 is a circuit diagram showing a second connector connected to a third connector of a control board of FIG. 8.

The receiving member 62 is box-shaped, and includes a first sidewall 621, a top wall 622, a second sidewall 623 opposite to the first sidewall 621, and a bottom wall 624 opposite to the top wall 622. The first sidewall 621, the top wall 622, the second sidewall 623 and the bottom wall 624 are connected end to end, bounding an opening 625. A third sidewall 626 connected to the first sidewall 621, the top wall 622, the second sidewall 623, and the bottom wall 624 is opposite to the opening 625 as shown in FIG. 5. An engaging portion 6212 defining a first hole 6214 vertically extends from the first sidewall 621 towards the second sidewall 623, adjacent to the opening 625. A second hole 6262 is defined in the third sidewall 626, corresponding to the first hole 6214. A plurality of ventilation holes 6264 are defined in the third sidewall 626, for the blowers 4 guiding heat outside of the receiving member 62. A board 627 extends from the bottom wall 624, opposite to the third sidewall 626. Two fastening holes 6272 are defined in the board 627, corresponding to the through holes 56 of the control board 5, to mount the control board 5 to the motherboard 2 via some connection members, such as screws. Four assembly holes 6242 are defined in the bottom wall 624, corresponding to the through holes 46 of the two blowers 4.

In assembly, the spring 63 fits about the main body 612 of the connection member 61. A second end opposite to the head 614 of the main body 612 of the connection member 61 passes through the second hole 6262 of the third sidewall 626, the first hole 6214 of the engaging portion 6212 of the receiving member 62, with the head 614 of the connection member 61 fixed to the third sidewall 626, and the spring 63 sandwiched between the engaging portion 6212 and the protrusion 6122 of the connection member 61. Four screws 42 pass through the through holes 46 of the blowers 4, to lock into the assembly holes 6242 of the receiving member 62, to mount the blowers 4 to the receiving member 62. Two screws 58 pass through the through holes 56 of the control board 5 and lock into the fastening holes 6272 of the receiving member 62, to mount the control board 5 to the board 627 of the receiving member 62. The blowers 4 are electrically connected to the third connectors 54, respectively, to communicate with the control board 5.

The fixing member 16 is placed on the base 14, with the fixing holes 166 of one tab 164 aligning with the corresponding through holes 142 of the base 14. The cover 12 covers on the base 14, with the through holes 122 of the cover 12 aligning with the fixing holes 166 of the other tab 164. Screws 124 pass through the through holes 122 of each of the cover 12 and the base 14 and lock into the fixing holes 166 of a corresponding tab 164 of the fixing member 16, to mount the cover 12 to the base 14, to form the chassis 1 with an opening 18 defined in one end of the chassis 1. The heat dissipation apparatus 3 is received in the chassis 1 through the opening 18, the second end of the connection member 61 is locked into the mounting hole 162 of the fixing member 16, to mount the heat dissipation apparatus 3 to the chassis 1, the second connector 52 being inserted into the first connector 22.

In use, the first connector 22 of the motherboard 2 outputs a power supply signal and two speed regulation signals to the second connector 52. The two third connectors 54 output two speed regulation signals to the two blowers 4, respectively, to dissipate heat generated by the motherboard 2. The two blowers 4 output rotary speed signals to the motherboard 2 via the third connector 54, the second connector 52, and the first connector 22, therefore the motherboard 2 can monitor the rotary speeds of the two blowers 4.

Referring to FIGS. 8 to 12, a second embodiment of an electronic device with another heat dissipation apparatus 10 is shown. A difference between the heat dissipation apparatuses 10 and 3 is as follows. The heat dissipation apparatus 10 includes four groups of fans including eight fans 7, a receiving member 9 for receiving the eight fans 7, and a control board 8. The control board 8 includes a second connector 86 for connecting to the first connector 22 of the motherboard 2, and four third connectors 82 electrically connected to the second connector 86. Four locking holes 74 are defined in four corners of each fan 7. Screws (not shown) pass through the locking holes 74 of two fans 7, with the two fans 7 resisting against each other, to mount the two fans 7 in series together. The two fans 7 are electrically connected in series, and electrically connected to one of the third connector 82. The receiving member 9 is box-shaped and defines an opening in one side. A plurality of through holes 92 are defined in a sidewall opposite to the opening of the receiving member 9, for mounting the fans 7. The connection member 61 passes through the sidewall, fits about the spring 63, to mount the heat dissipation apparatus 10 to the chassis 1, with the connection member 61 locked into the mounting hole 162 of the fixing member 16.

Structures and names of pins of the first connector 22 and the third connector 82 are the same as structures and names of the pins of the first exemplary of the first connector 22 and the third connector 54. Structure of the second connector 86 is the same as structure of the first exemplary of the second connector 52, and names of the pins 1-5, 10-6 of the second connector 86 from left to right are shown in table 3.

TABLE 3

| | pins of the second connector | | | | |
|---|---|---|---|---|---|
| Top row | 1 | 2 | 3 | 4 | 5 |
| Name | power supply | rotary speed | rotary speed | rotary speed | rotary speed |
| Bottom row | 10 | 9 | 8 | 7 | 6 |
| Name | ground | speed regulation | speed regulation | speed regulation | speed regulation |

Each column of two pins in table 3 as a group, such as the "rotary speed" pin 2 and the "speed regulation" pin 9, control two fans 7 in series. Obviously, the second connector 86 can be inserted into the first connector 22, therefore the power supply signal pin 1, rotary speed signal pins 2-5, and speed regulation signal pins 6-9 of the second connector 86 are correspondingly connected to the power supply signal, rotary speed signal pins, and speed regulation signal pins of the first connector 22.

The third connector 22 receives a power signal, speed regulation signals from the motherboard 2 and outputs rotary speed signals to the motherboard 2 via the second connector 86 and the first connector 22. The power supply pins of the four third connectors 82 are connected to the power supply pin 1 of the second connector 86. Ground pins of the four third connectors 82 are connected to the ground pin 10 of the second connector 86. A rotary speed pin 2 and a speed regulation pin 3 of a first one of the third connectors 82 are connected to the rotary speed pin 2 and the speed regulation pin 9 of the second connector 86. A rotary speed pin 2 and a speed regulation pin 3 of a second one of the third connectors 82 are connected to the rotary speed pin 3 and the speed regulation pin 8 of the second connector 86. A rotary speed pin 2 and a speed regulation pin 3 of a third one of the third connector 82 are connected to the rotary speed pin 4 and the speed regulation pin 7 of the second connector 86. A rotary speed pin 2 and a speed regulation pin 3 of a fourth one of the third connector 82 are connected to the rotary speed pin 5 and the speed regulation pin 6 of the second connector 86.

In use, the motherboard 2 outputs a power supply signal and four speed regulation signals via the first connector 22, the second connector 86, and the third connectors 82. Four groups of the fans 7 receive the power supply signal and the speed regulation signals respectively, and the four groups of fans 7 output rotary speed signals to the motherboard 2.

When the heat dissipation apparatus 3 with blowers 4 is replaced by the heat dissipation apparatus 10 with fans 7, the chassis 1 of the electronic device need not be altered, which can reduce cost and is conveniently to be used.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. An electronic device comprising:
   a chassis defining a first opening and comprising a fixing member;
   a motherboard received in the chassis and comprising a first connector for receiving power supply signals and control signals from the motherboard; and
   a heat dissipation apparatus comprising:
      a receiving member operable to be received in the chassis through the first opening;
      a connection member mounted to the receiving member, operable to be mounted to the fixing member;
      a control board mounted to the receiving member, and comprising a second connector for connecting to the first connector and receiving the power supply signals and the control signals, and at least one third connector for receiving and outputting the power supply signals and the control signals from the second connector; and
      at least one heat dissipation component received in the receiving member, and connected to the at least one third connector to receive the power supply signals and the control signals to dissipate heat for the motherboard.

2. The electronic device of claim 1, wherein the chassis comprises a base, and a cover covering on the base, the fixing member is arranged between the base and the cover, a mounting hole is defined in the fixing member to mount the connection member, a top end of the fixing member is fixed to the cover, a bottom end of the fixing member is fixed to the base.

3. The electronic device of claim 1, wherein the receiving member comprises a first sidewall, a top wall, a second sidewall opposite to the first sidewall, and a bottom wall opposite to the top wall, the first sidewall, the top wall, the second sidewall, and the bottom wall are connected end to end to bound a second opening, a third sidewall connected to the first sidewall, the top wall, the second sidewall, and the bottom wall is opposite to the second opening and covers the first opening of the chassis, and a plurality of ventilation holes are defined in the third sidewall, for the heat dissipation apparatus guiding heat outside of the chassis.

4. The electronic device of claim 3, wherein an engaging portion defining a first hole vertically extends from the first sidewall towards the second sidewall, adjacent to the second opening, a second hole is defined in the third sidewall corresponding to the first hole, the connection member comprises a main body and a head extending from a first end of the main body, a ring-shaped protrusion protrudes from a circumference of the main body, the heat dissipation apparatus further comprises a spring, a second end opposite to the head of the main body of the connection member passes through the second hole of third sidewall, the spring, and the first hole of the engaging portion, with the head fixed to the third sidewall, and the spring sandwiched between the engaging portion and the protrusion of the connection member.

5. The electronic device of claim 3, wherein a board extends from the bottom wall away from the third sidewall, for supporting and mounting the control board.

6. The electronic device of claim 1, wherein the at least one heat dissipation component comprises a blower, the at least one third connector comprises one third connector and receives state signals of the blower, and outputs the state signals to the motherboard via the first and second connectors, the control signals are speed regulation signals of the blower, and the state signals are rotary speed signals of the blower.

7. The electronic device of claim 1, wherein the at least one heat dissipation component comprises a fan, the at least one third connector comprises one third connector and receives state signals of the fan, and outputs the state signals to the motherboard via the first and second connectors, the control signals are speed regulation signals of the fan, and the state signals are rotary speed signals of the fan.

8. A heat dissipation apparatus for dissipating heat for an electronic device, the heat dissipation apparatus comprising:
   a receiving member operable to be received in the electronic device;
   a connection member mounted to the receiving member, operable to be fixed to the electronic device;
   a control board mounted to the receiving member, and comprising a first connector for electrically connecting to the electronic device to receive power supply signals and control signals, and at least one second connector for receiving and outputting the power supply signals and the control signals; and
   at least one heat dissipation component received in the receiving member, and each electrically connected to a corresponding one of the at least one second connector, to receive the power supply signals and the control signals, to dissipate heat for the motherboard.

9. The heat dissipation apparatus of claim 8, wherein the receiving member comprises a first sidewall, a top wall, a second sidewall opposite to the first sidewall, and a bottom wall opposite to the top wall, the first sidewall, the top wall, the second sidewall, and the bottom wall are connected end to end to bound an opening, a third sidewall connected to the first sidewall, the top wall, the second sidewall, and the bottom wall is opposite to the opening, and a plurality of ventilation holes are defined in the third sidewall, corresponding to the at least one heat dissipation component.

10. The heat dissipation apparatus of claim 9, wherein an engaging portion defining a first hole vertically extends from the first sidewall towards the second sidewall, adjacent to the opening, a second hole is defined in the third sidewall corresponding to the first hole, the connection member comprises a column-shaped main body and a head connected to a first end of the main body, a ring-shaped protrusion protrudes from a circumference of the main body, the heat dissipation apparatus further comprises a spring, a second end opposite to the first end of the main body of the connection member passes through the second hole, fitting about the spring, and passes through the first hole of the engaging portion, with the head fixed to the third sidewall and the spring sandwiched between the protrusion and the engaging portion.

11. The heat dissipation apparatus of claim 9, wherein a board extends from the bottom wall away from the third sidewall, adjacent to the opening, for supporting and mounting the control board.

* * * * *